(12) United States Patent
Tsai et al.

(10) Patent No.: US 12,080,603 B2
(45) Date of Patent: Sep. 3, 2024

(54) ACTIVE REGION CUT PROCESS

(71) Applicant: Taiwan Semiconductor Manufacturing Company, Ltd., Hsinchu (TW)

(72) Inventors: Han-Yu Tsai, Hsinchu (TW); Zu-Yin Liu, Hsinchu (TW); You-Ting Lin, Hsinchu (TW); Jiun-Ming Kuo, Taipei (TW); Kuo-Chin Liu, Hualien County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 546 days.

(21) Appl. No.: 17/461,247

(22) Filed: Aug. 30, 2021

(65) Prior Publication Data
US 2023/0066097 A1 Mar. 2, 2023

(51) Int. Cl.
*H01L 21/8234* (2006.01)
*H01L 29/06* (2006.01)
*H01L 29/66* (2006.01)

(52) U.S. Cl.
CPC .. *H01L 21/823431* (2013.01); *H01L 29/0649* (2013.01); *H01L 29/66795* (2013.01)

(58) Field of Classification Search
CPC ......... H01L 21/823431; H01L 21/3081; H01L 21/823481; H01L 21/823878; H01L 29/42392; H01L 29/78696; H01L 29/0673; H01L 29/42376; H01L 29/66795; H01L 29/66439
See application file for complete search history.

(56) References Cited

U.S. PATENT DOCUMENTS

| | | | |
|---|---|---|---|
| 9,406,521 B1* | 8/2016 | Liou | H01L 29/785 |
| 9,818,872 B2 | 11/2017 | Ching et al. | |
| 9,887,269 B2 | 2/2018 | Ching et al. | |
| 9,899,398 B1 | 2/2018 | Colinge et al. | |
| 10,032,627 B2 | 7/2018 | Lee et al. | |
| 10,109,721 B2 | 10/2018 | Lin et al. | |
| 10,157,799 B2 | 12/2018 | Ching et al. | |
| 10,199,502 B2 | 2/2019 | Huang et al. | |
| 10,290,546 B2 | 5/2019 | Chiang et al. | |
| 10,475,902 B2 | 11/2019 | Lee et al. | |
| 2017/0092507 A1* | 3/2017 | Chi | H01L 21/3081 |
| 2018/0175036 A1 | 6/2018 | Ching et al. | |
| 2018/0226403 A1* | 8/2018 | Chen | H01L 29/0649 |

* cited by examiner

*Primary Examiner* — Tuan A Hoang
(74) *Attorney, Agent, or Firm* — HAYNES AND BOONE, LLP

(57) ABSTRACT

A method of the present disclosure includes forming a fin-shaped structure including a plurality of semiconductor layers, a first hard mask layer, a second hard mask layer, and a third hard mask layer, forming a patterned masking layer having a mask portion and a window portion, wherein the third hard mask layer is exposed through the window portion, performing a first etch process to expose the second hard mask layer through the window portion, performing a second etch process to etch the exposed second hard mask layer and to leave behind second hard mask layer residues, performing a third etch process to remove the second hard mask layer residues, etching the plurality of semiconductor layers in the fin-shaped structure through the window portion to divide the fin-shaped structure into a first segment and a second segment, and forming an isolation feature around the first segment and the second segment.

20 Claims, 19 Drawing Sheets

ACTIVE REGION CUT PROCESS

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, or other nanostructures and for that reasons, an MBC transistor may also be referred to as a nanowire transistor or a nanosheet transistor.

An active region of a multi-gate device may, at least during part of the fabrication process, come in an elongated fin shape. Depending on the design, the active region may be divided into two or more segments for formation of different semiconductor devices. The process to divide an active region into two or more segments may be referred to as a fin cut process or active region cut process. An active region cut process may be accomplished using one or more hard mask layers over the active region. Undesirable residues of the one or more hard mask layers may lead to defects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
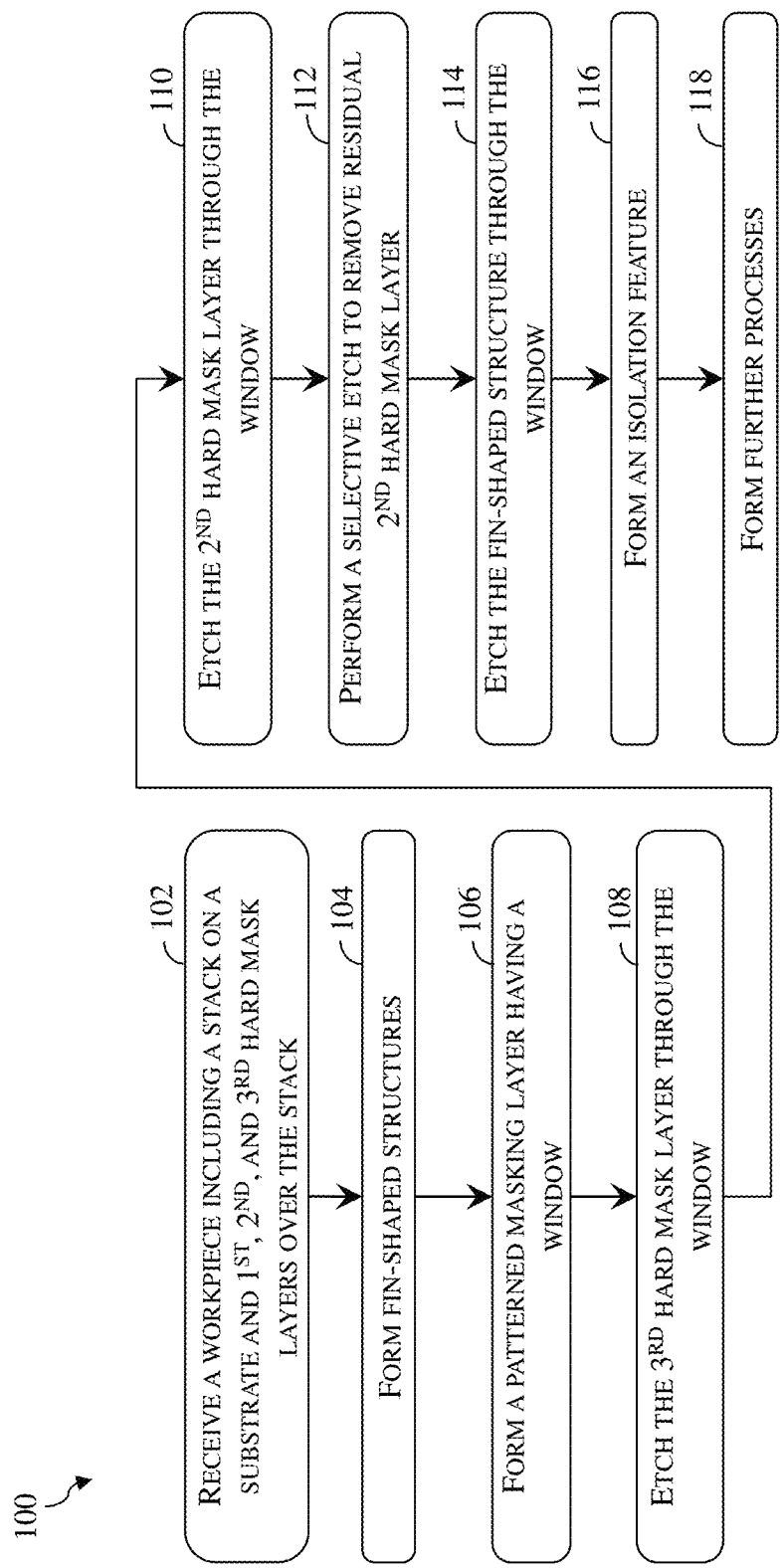
FIG. 1 illustrates a flowchart of a method for forming a semiconductor device, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to a semiconductor device fabrication process, and more particularly to an active region cut process.

In semiconductor fabrication, an active region of a multi-gate device refers a semiconductor structure where a channel, a source, and a drain are formed. An active region of a multi-gate device may be surrounded by or defined in an isolation feature, such as a shallow trench isolation (STI) feature. For example, an active region of a FinFET is a fin that traverses a substrate. An active region of an MBC is a fin-shaped structure. Different from a FinFET fin's solid semiconductor construction, a fin-shaped structure of an MBC transistor includes an alternating stack of two different semiconductor layers. In order to form electrically isolated multi-gate devices, an active region may undergo an active region cut process or a fin cut process to be divided into more than two segments. The active region cut process may include forming a patterned masking layer to expose a cut portion of an active region and one or more etch processes to etch the cut portion of the active region. In some examples, the one or more etch processes etch through one or more hard mask layers on the active region. When there are residues of the one or more hard mask layers over the cut portion or when thickness of the patterned masking layer is not satisfactory, over-etching or under-etching of the cut portion may be resulted, leading to gate-source/drain shorts or defective source/drain features.

The present disclosure provides embodiments of active region cut processes. In some embodiments, a workpiece having a fin-shaped structure is formed. A first hard mask layer, a second hard mask layer, and a third hard mask layer are disposed over the fin-shaped structure. To cut the fin-shaped structure by removing a cut portion thereof, a patterned masking layer is deposited over the workpiece. The patterned masking layer includes a window portion over the cut portion and a mask portion covering the rest of the fin-shaped structure. A thickness of the window portion of the patterned masking layer is smaller than that of the mask portion to expose the third mask layer over the cut portion. A first etch process is performed to etch the exposed third mask layer to expose the second mask layer in a trench. A second etch process is then performed to etch the exposed second mask layer to expose the first mask layer. A selective third etch process is then performed to remove any residual second hard mask layer over the cut portion and to pull back the masking layer. The third etch process may be a dry etch process that uses fluoromethane ($CH_3F$), sulfur dioxide ($SO_2$), oxygen ($O_2$), argon (Ar), or helium (He). After the third etch process, the cut portion of the fin-shaped structure is removed to divide the fin-shaped structure into a first segment and a second segment. The removal of the residual second hard mask layer allows satisfactory removal of the cut portion of the fin-shaped structure, thereby ensuring integrity of the first segment and the second segment.

The various aspects of the present disclosure will now be described in more detail with reference to the figures. FIG. 1 illustrates a flowchart of a method 100 of forming a semiconductor device from a workpiece according to one or more aspects of the present disclosure. Method 100 is merely an example and is not intended to limit the present disclosure to what is explicitly illustrated in method 100. Additional steps may be provided before, during and after method 100, and some steps described can be replaced, eliminated, or moved around for additional embodiments of the methods. Not all steps are described herein in detail for reasons of simplicity. Method 100 is described below in conjunction with FIGS. 2-19, which illustrate fragmentary cross-sectional views and top views of a workpiece 200 at different stages of fabrication according to embodiments of method 100. Because a semiconductor device will be formed from the workpiece 200, the workpiece 200 may be referred to as a semiconductor device 200 as the context requires. Although embodiments that include MBC transistors are illustrated in the figures, the present disclosure is not so limited and may be applicable to other multi-gate devices, such as FinFETs. Throughout the present disclosure, like reference numerals denote like features, unless otherwise excepted.

Figure 2:
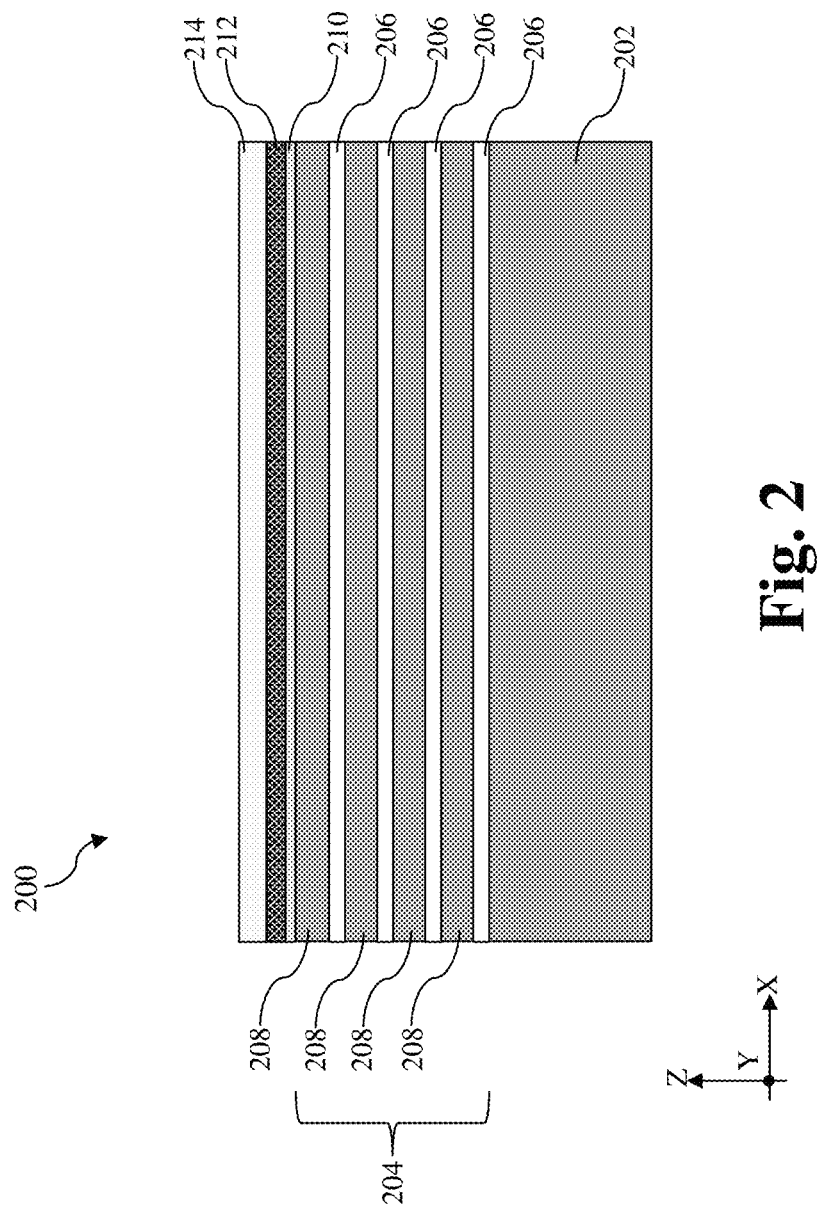
FIGS. 2-19 illustrate fragmentary cross-sectional or top views of a workpiece during various fabrication stages in the method of FIG. 1, according to one or more aspects of the present disclosure.

Referring to FIGS. 1 and 2, method 100 includes a block 102 where a workpiece 200 is received. As shown in FIGS. 2A, 2B and 2C, the workpiece 200 includes a substrate 202, a stack 204 disposed on the substrate 202, a first hard mask layer 210 over the stack 204, a second hard mask layer 212 over the first hard mask layer 210, and a third hard mask layer 214 over the second hard mask layer 212. In one embodiment, the substrate 202 may be a silicon (Si) substrate. In some other embodiments, the substrate 202 may include other semiconductors such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 202 may also include an insulating layer, such as a silicon oxide layer, to have a silicon-on-insulator (SOI) structure or a germanium-on-insulator (GeOI) structure. In some embodiments, the substrate 202 may include one or more well regions, such as n-type well regions doped with an n-type dopant (i.e., phosphorus (P) or arsenic (As)) or p-type well regions doped with a p-type dopant (i.e., boron (B) or boron difluoride ($BF_2$)), for forming different types of devices. The doping the n-type wells and the p-type wells may be formed using ion implantation or thermal diffusion.

Referring still to FIG. 2, the stack 204 may include a plurality of channel layers 208 interleaved by a plurality of sacrificial layers 206. The channel layers 208 and the sacrificial layers 206 may have different semiconductor compositions. In some implementations, the channel layers 208 are formed of silicon (Si) and sacrificial layers 206 are formed of silicon germanium (SiGe). In these implementations, the additional germanium content in the sacrificial layers 206 allow selective removal or recess of the sacrificial layers 206 without substantial damages to the channel layers 208. In some embodiments, the sacrificial layers 206 and channel layers 208 may be deposited using an epitaxial process. The stack 204 may be epitaxially deposited using CVD deposition techniques (e.g., vapor-phase epitaxy (VPE) and/or ultra-high vacuum CVD (UHV-CVD)), molecular beam epitaxy (MBE), and/or other suitable processes. The sacrificial layers 206 and the channel layers 208 are deposited alternatingly, one-after-another, to form the stack 204. It is noted that four (4) layers of the sacrificial layers 206 and four (4) layers of the channel layers 208 are alternately and vertically arranged as illustrated in FIG. 2, which is for illustrative purposes only and not intended to be limiting beyond what is specifically recited in the claims. The number of layers depends on the desired number of channels members for the semiconductor device 200. In some embodiments, the number of the channel layers 208 is between 2 and 10.

For patterning purposes, the workpiece 200 may also include the first hard mask layer 210 over the stack 204, the second hard mask layer 212 over the first hard mask layer 210, and the third hard mask layer 214. In some embodiments, the first hard mask layer 210 is formed of silicon oxide and may be referred to as a pad oxide layer 210; the second hard mask layer 212 is formed of silico nitride; and the third hard mask layer 214 is formed of silicon oxide. The first hard mask layer 210 functions as an etch selectivity or etch stop layer during the etch of the second hard mask layer 212. As the first hard mask layer 210 is not needed after the etching of the second hard mask layer 212, the second mask layer may have the smallest thickness among the three hard mask layers over the stack 204. In some instances, the first hard mask layer 210 may have a first thickness T1 between 1 nm and about 5 nm. The second hard mask layer 212 has a second thickness T2 that is greater than the first thickness T1. In some instances, the second thickness T2 may be between about 10 nm and about 25 nm. As will be described further below, the third hard mask layer 214 is a self-aligned trench creation layer that, when selectively removed, forms a trench in a patterned masking layer (to be described below). The trench created by the removal of the third hard mask layer 214 provides control over the etching of the second hard mask layer 212. To effectively create the trench, the third hard mask layer 214 has a third thickness T3 that is greater than the second thickness T2. In some instances, the third thickness T3 may be between about 20 nm and about 50 nm.

Figure 3:
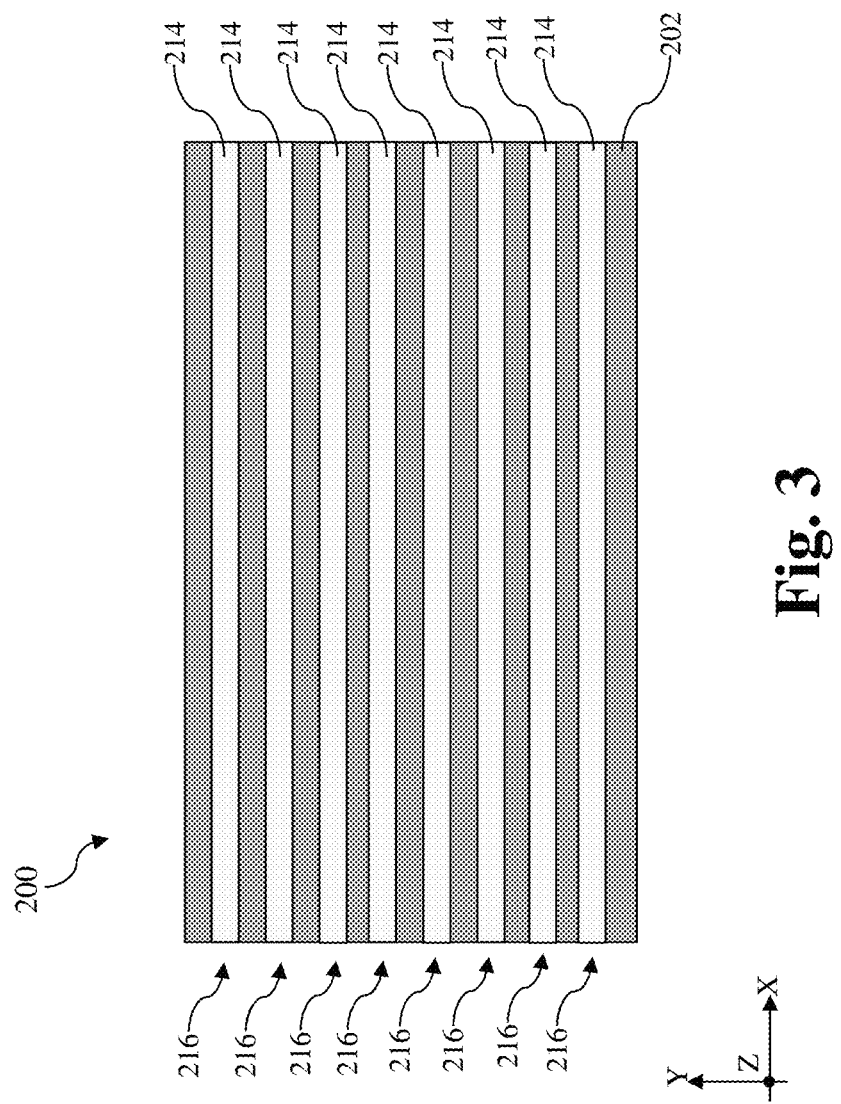
Figure 5:
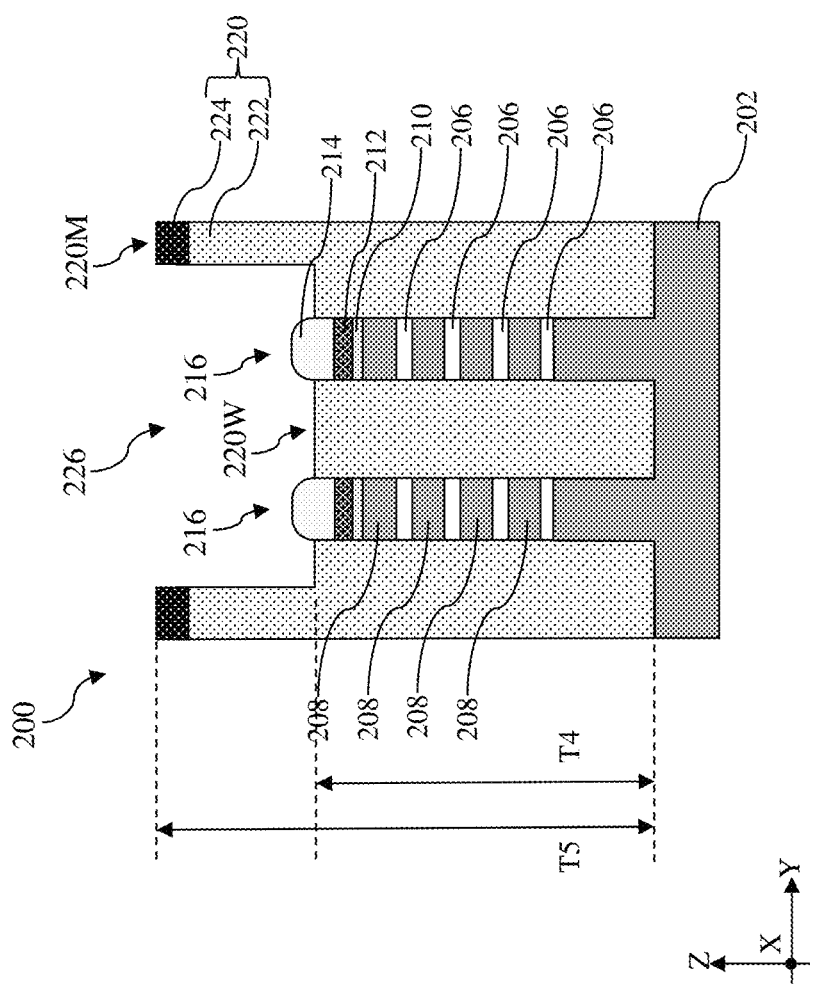

Referring to FIGS. 1 and 3, method 100 includes a block 104 where fin-shaped structure 216 are formed. At block 104, the stack 204 and the substrate 202 are patterned to form the fin-shaped structures 216. FIG. 3 is a fragmentary top view of the workpiece 200 after the fin-shaped structures 216 are formed. As shown in FIG. 3, the fin-shaped structures 216 extend lengthwise along the X direction across the substrate 202. Reference is temporarily made to FIG. 5, which representatively illustrates the fin-shaped structures 216 extend vertically along the Z direction from the substrate 202. The fin-shaped structures 216 in FIG. 3 may be patterned using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The material layer is then removed, and the remaining spacers, or mandrels, may then be used to pattern the fin-shaped structures 216 by etching the stack 204 and the substrate 202. The etching process can include dry etching, wet etching, reactive ion etching (RIE), and/or other suitable processes. As shown in FIG. 5, after the formation of the fin-shaped structures 216, the first hard mask layer 210, the second hard mask layer 212, and the third hard mask layer 214 are also patterned and disposed over each of the fin-shaped structures 216. In some embodiments, the top surface of the third hard mask layer 214 may be rounded as a result of patterning of the fin-shaped structures 216.

Figure 4:
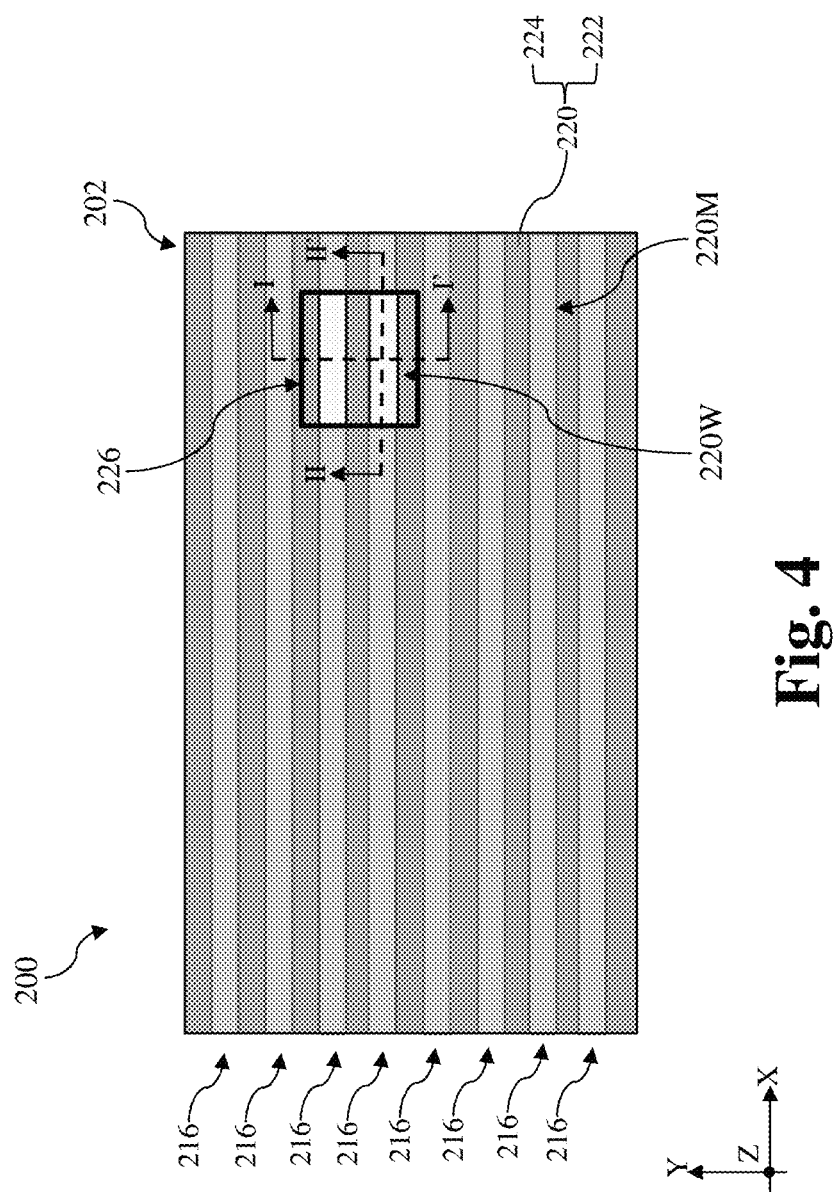

Referring to FIGS. 1, 4, 5, and 6, method 100 includes a block 106 where a patterned masking layer 220 is formed. The patterned masking layer 220 may include a bottom layer 222 and a middle layer 224. The bottom layer 222 may include carbon (C), hydrogen (H), oxygen (O), nitrogen (N), or fluorine (F). In some instances, in the bottom layer 222, the carbon content may be between about 30% and about 80%, the hydrogen content may be between about 0% and about 60%, the oxygen content may be between about 0% and about 25%, and the nitrogen content may be between about 0% and about 5%. The middle layer 224 may include carbon (C), hydrogen (H), oxygen (O), silicon (Si), nitrogen (N), or fluorine (F). In some instances, in the middle layer 224, the carbon content may be between about 5% and about 20%, the hydrogen content may be between about 0% and about 5%, the oxygen content may be between about 30% and about 50%, the silicon content may be between about 40% and about 50%, and the nitrogen content may be between about 0% and about 5%. The bottom layer 222 may be referred to as a silicon-free layer (i.e., no silicon is intentionally doped in the bottom layer 222) and the middle layer 224 may be referred to as a silicon-containing layer. As shown in FIG. 4, the patterned mask layer 220 includes a window 226. Cross-section I-I' in FIG. 4 along the Y direction is illustrated in the fragmentary cross-sectional view in FIG. 5. Cross-section II-II' in FIG. 4 along the X direction is illustrated in the fragmentary cross-sectional view in FIG. 6. Cross-section I-I' cuts through fin-shaped structures 216 in the window 226. Cross-section II-II' cuts along a lengthwise direction of a fin-shaped structure 216 in the window 226.

In an example process to form the patterned masking layer 220, the bottom layer 222 and the middle layer 224 are sequentially deposited over the fin-shaped structures 216 using chemical vapor deposition (CVD), flowable CVD (FCVD), or spin-on coating. Then a photoresist layer (not shown) is then deposited over the middle layer 224. The photoresist layer may also be referred to as a top layer or a photosensitive layer. The photoresist layer is patterned using a photolithography process, where the photoresist layer is soft-baked, exposed to radiation reflected from or transmitting through a photo mask, baked in a post-bake process, and developed in a developer solution. The patterned photoresist layer is then applied as an etch mask to pattern the bottom layer 222 and the middle layer 224 to form the patterned masking layer 220. The photoresist layer is then removed by ashing, stripping, or a suitable method.

Figure 6:
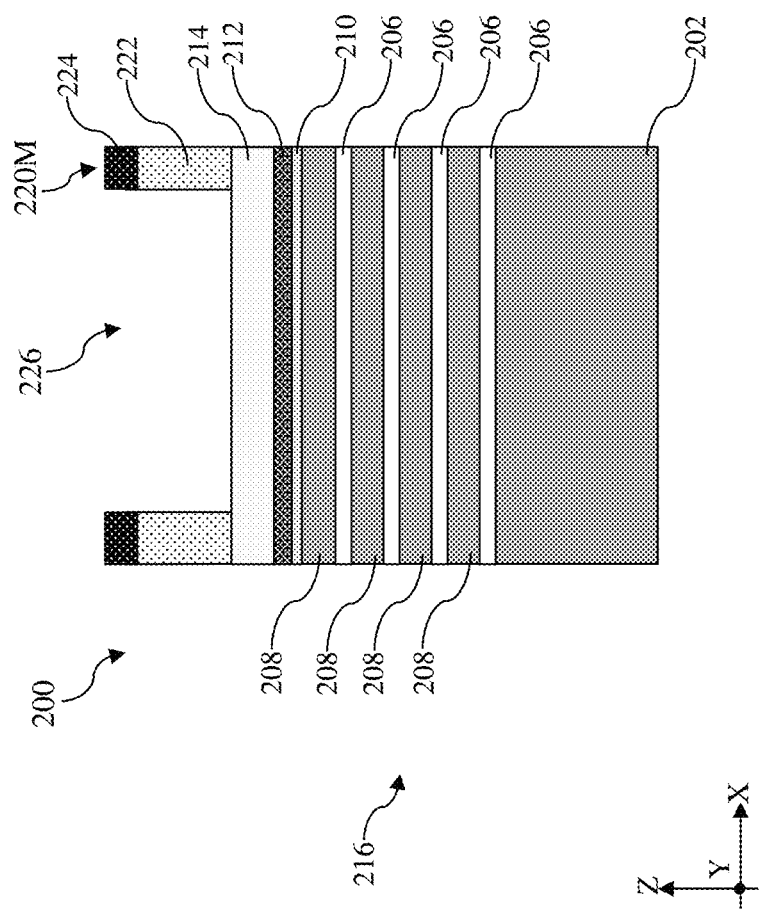

Referring now to FIGS. 4 and 5, the window 226 represents a portion of the patterned masking layer 220 that is thinner than the other portion of the patterned masking layer 220. For ease of reference, the portion of the patterned masking layer 220 in the window 226 is referred to as a window portion 220W and the portion of the patterned masking layer 220 outside the window 226 is referred to as a mask portion 220M. As shown in FIG. 5, the window portion 220W has a fourth thickness T4 and the mask portion 220M has a fifth thickness T5 greater than the fourth thickness T4. In some instances, the fourth thickness T4 may be between about 180 nm and about 300 nm and the fifth thickness T5 may be between about 250 nm and about 520 nm. In some embodiments represented in FIG. 5, the fourth thickness T4 is selected such that a portion of the third mask layer 214 are exposed from the window portion 220W while the rest of the fin-shaped structures 216 in the window remain covered and protected by the window portion 220W. As cross-section II-II' cuts along the length of a fin-shaped structure 216, the third mask layer 214 in the window 226 are exposed, as shown in FIG. 6.

Figure 7:
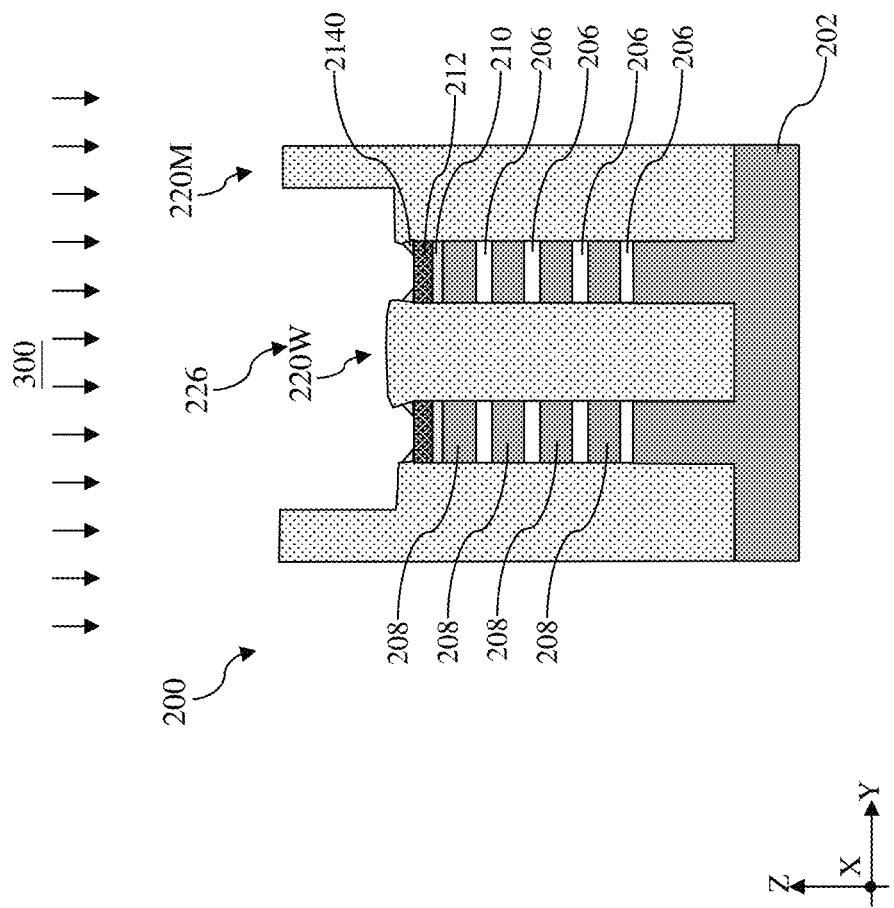
Figure 8:
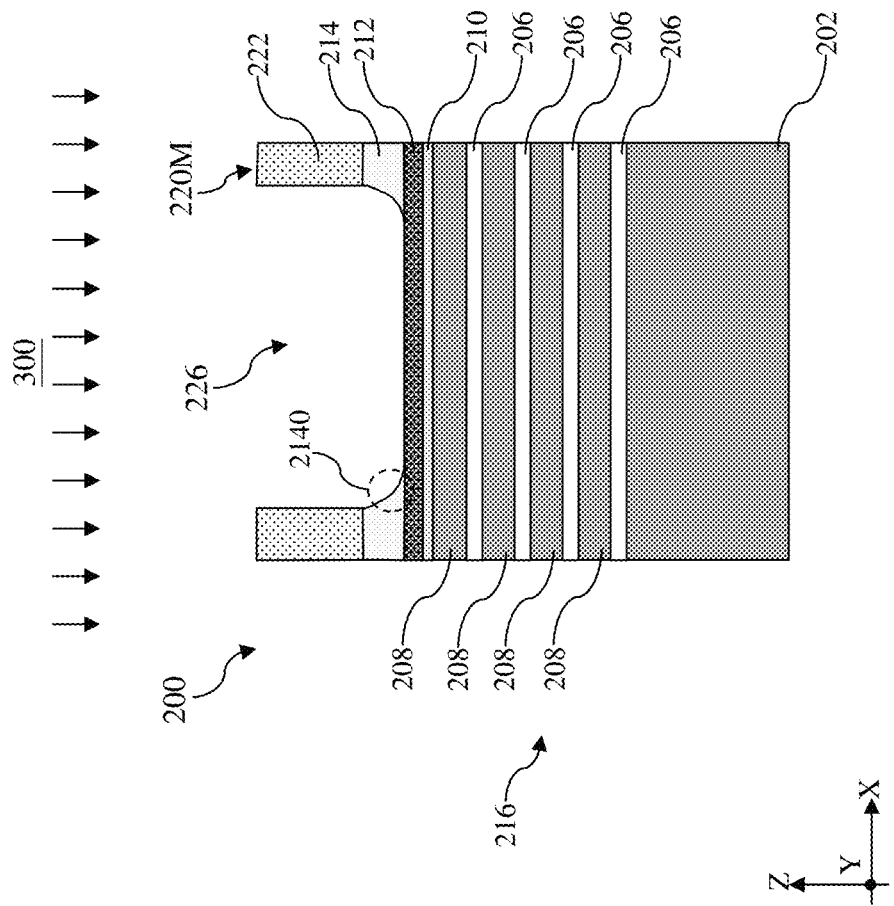

Referring to FIGS. 1, 7 and 8, method 100 includes a block 108 where a third hard mask layer 214 is etched. At block 108, a first etch process 300 is performed to etch the third hard mask layer 214. In some embodiments, the first etch process 300 is a dry etch process that includes use of oxygen ($O_2$), a fluorine-containing gas (e.g., $CF_4$, $NF_3$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. The etch of the third hard mask layer 214 may expose the second hard mask layer 212 below. Because the window portion 220W of the patterned masking layer 220 is not substantially etched at block 108, the etch of third hard mask layer 214 results in trenches into the window portion 220W. Due to the restricted line of sight caused by such trenches, third hard mask layer residues 2140 may be resulted upon conclusion of the operations at block 108. The third hard mask layer residues 2140 may be disposed around the corners of the trenches, as shown in FIGS. 7 and 8.

Figure 9:
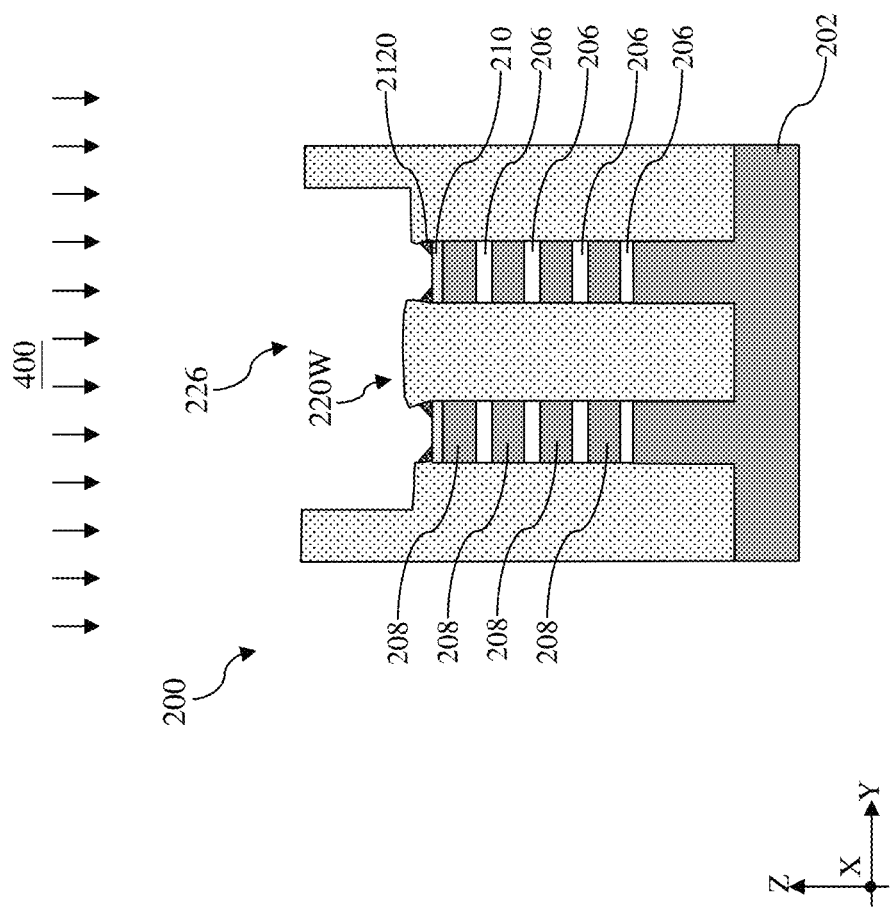
Figure 10:
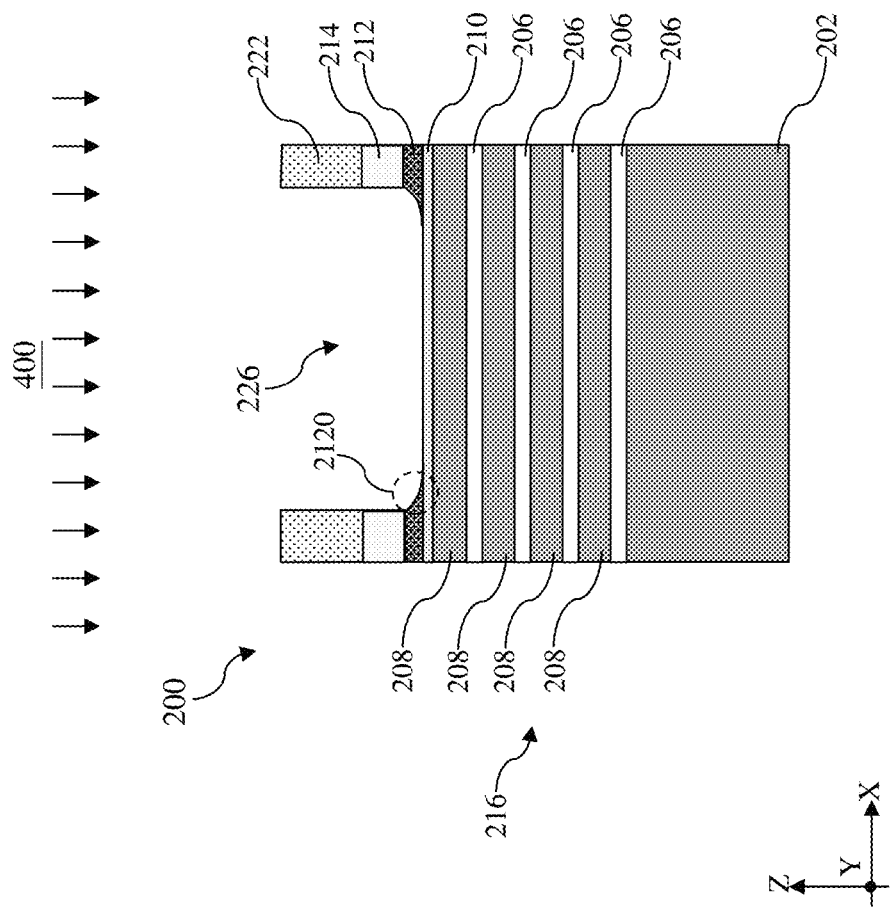

Referring to FIGS. 1, 9 and 10, method 100 includes a block 110 where a second hard mask layer 212 is etched. At block 110, a second etch process 400 is performed to etch the second hard mask layer 212 exposed after operations at block 108. In some embodiments, the second etch process 400 is a dry etch process that includes use of nitrogen ($N_2$), ammonia ($NH_3$), oxygen ($O_2$), sulfur dioxide ($SO_2$), a fluorine-containing gas (e.g., $CF_4$, $NF_3$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. In some implementations, the second etch process 400 may include a main etch step and an over etch step. The main etch step may include use of a fluorine-containing gas (e.g., $CF_4$, $NF_3$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas. The over etch step may include the reactants in the main etch step and further include oxygen ($O_2$), sulfur dioxide ($SO_2$), and a nitrogen-containing gas, such as nitrogen ($N_2$), ammonia ($NH_3$). The etch of the third hard mask layer 214 may expose the second hard mask layer 212 below. Due to presence of third hard mask layer residues 2140 at the conclusion of block 108, second hard mask layer residues 2120 may be resulted upon conclusion of the operations at block 110. The second hard mask layer residues 2120 may be disposed around the corners of the trenches in the window portion 220W, as shown in FIGS. 9 and 10. In some existing technologies, the fin-shaped structures 216 are etched without satisfactorily removing the second hard mask layer residues 2120, which may lead to insufficient removal of the cut portion of the fin-shaped structures 216. Insufficient removal of the cut portion may in turn lead to undesirable extensions of the resulted fin-shaped structure segments. In extreme cases, the undesirable extensions may cause gate-to-source/drain shorts. These trenches are functional as they prevent undercutting or overcutting of the fin-shaped structures along the X direction. If the sidewalls of the fin-shaped structures 216 are exposed at block 110, operations at block 112 may erode the fin-shaped structures 216 just outside the window 226, resulting in defective or missing epitaxial features.

Figure 11:
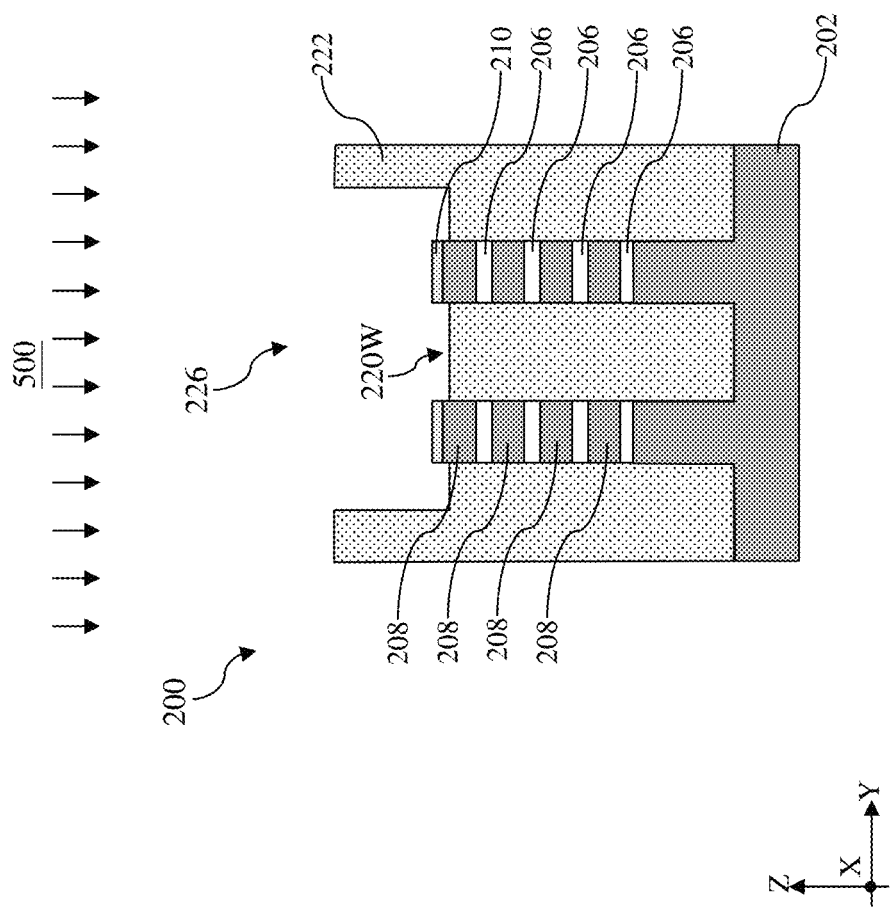
Figure 12:
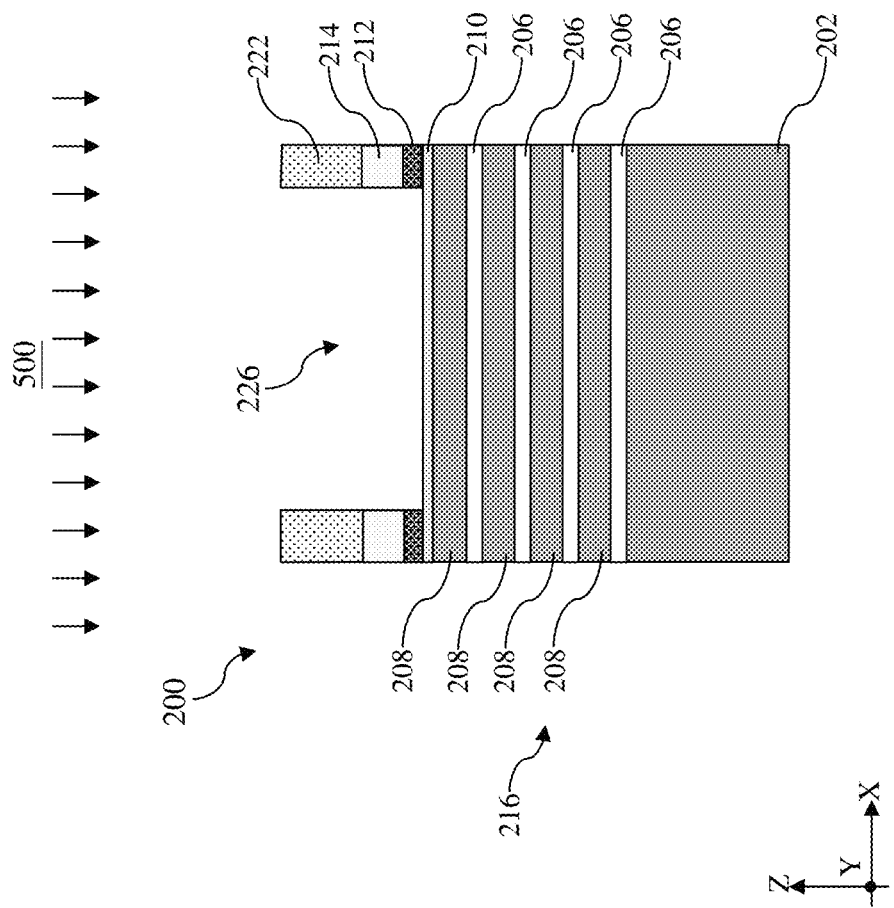

Referring to FIGS. 1, 11 and 12, method 100 includes a block 112 where a selective etch process is performed to remove second hard mask layer residues 2120. At block 112, a third etch process 500 is performed to selectively remove the second hard mask layer residues 2120. The third etch process 500 is different from the first etch process 300 or the second etch process 400. In some embodiments, the third etch process 500 is a dry etch process that includes use of fluoromethane ($CH_3F$), sulfur dioxide ($SO_2$), oxygen ($O_2$), argon (Ar), or helium (He). In the third etch process, argon (Ar) or helium (He) functions as inert carrier gas and both the plasma power and the bias are turned to continuous mode. The third etch process 500 includes a process pressure between about 70 mTorr and about 100 mTorr. In an example third etch process 500, fluoromethane ($CH_3F$) is supplied at a flow rate between about 100 standard cubic centimeter (sccm) and about 180 sccm, sulfur dioxide ($SO_2$) is supplied at a flow rate between about 10 sccm and about 20 sccm, oxygen ($O_2$) is supplied at a flow rate between about 10 sccm and about 20 sccm, argon (Ar) is supplied at a flow rate between about 800 sccm and about 1000 sccm, and helium is supplied at a flow rate between about 200 sccm and 250 sccm. The third etch process 500 is selective to the second hard mask layer 212 and etches the first hard mask layer 210 at a much slower rate. As shown in FIG. 11, the first hard mask layer 210 serves as an etch stop layer for the third etch process 500. In the depicted embodiments, the third etch process 500 also etches the patterned masking layer 220, specifically the bottom layer 222. In some instances illustrated in FIG. 11, the third etch process 500 reduces the thickness of the window portion 220W until the first hard mask layer 210 and a portion of the sidewalls of the topmost channel layer 208 are exposed.

Figure 13:
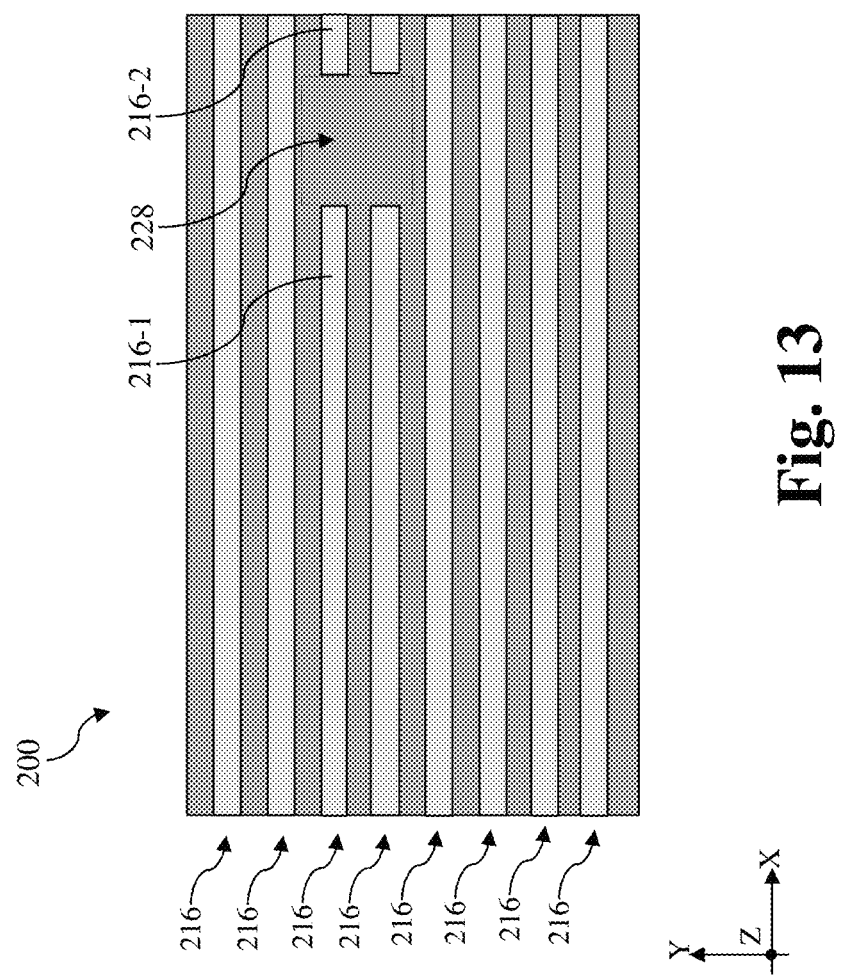

Referring to FIGS. 1 and 13, method 100 includes a block 114 where the fin-shaped structures 216 are etched using the patterned masking layer 220 as an etch mask. For ease of references, the portion of the fin-shaped structures 216 in the window 226 may be referred to as a cut portion while the portion of the fin-shaped structures 216 outside the window 226 may be referred to as a protected portion. In some embodiments, the cut portion of the fin-shaped structures 216 are etched using dry etch process that implements hydrogen ($H_2$), a fluorine-containing gas (e.g., $CF_4$, $NF_3$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. As shown in FIG. 13, the etch process at block 114 also removes the first hard mask layer 210 and substantially etches away the cut portion of the fin-shaped structures 216, leaving behind a vacant region 228. The vacant region 228 divides each of the fin-shaped structures 216 that overlap with the window 226 into two segments. For example, in FIG. 13, the vacant region 228 divides one such fin-shaped structure 216 into a first segment 216-1 and a second segment 216-2.

Figure 14:
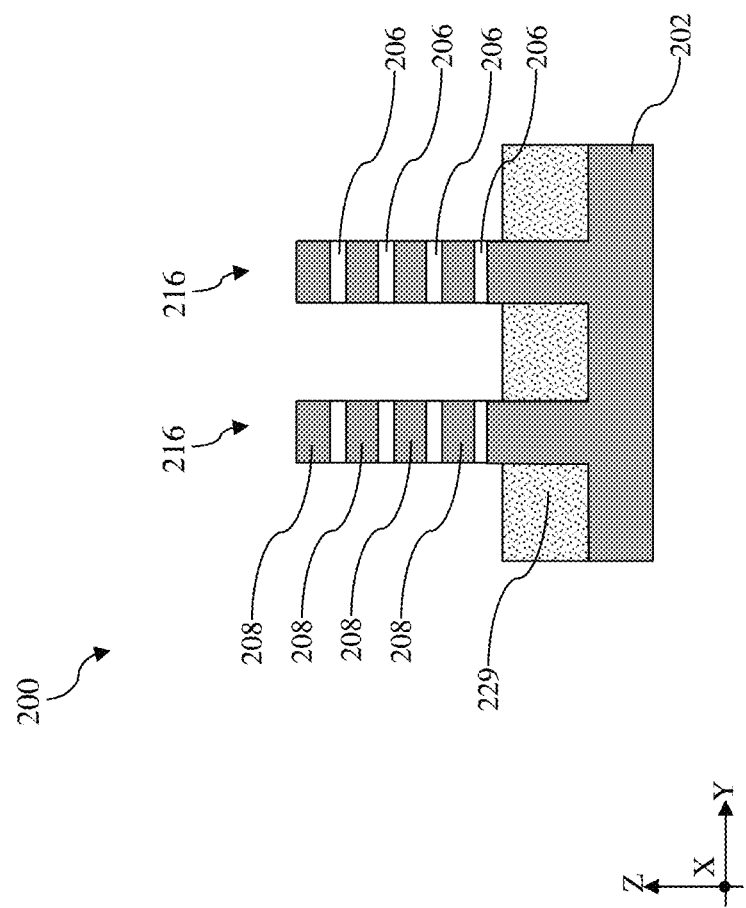

Referring to FIGS. 1 and 14, method 100 includes a block 116 where an isolation feature 229 is formed. After the fin-shaped structures 216 are divided into segments (such as the first segment 216-1 and the second segment 216-2 in FIG. 13) by vacant regions (such as the vacant region 228 in FIG. 13), the isolation feature 229 is formed between neighboring fin-shaped structures 216 or in vacant regions between segments. That is, the isolation feature 229 is in contact with terminal ends of the segments. The isolation feature 229 may also be referred to as a shallow trench isolation (STI) feature 229. In an example process, a dielectric material for the isolation feature 229 is first deposited over the workpiece 200, filling the trenches between fin-shaped structures 216 and the vacant regions with the dielectric material. In some embodiments, the dielectric material may include silicon oxide, fluorine-doped silicate glass (FSG), a low-k dielectric, combinations thereof, and/or other suitable materials. In various examples, the dielectric material may be deposited by CVD, subatmospheric CVD (SACVD), FCVD, spin-on coating, and/or other suitable processes. The deposited dielectric material is then thinned and planarized, for example by a chemical mechanical polishing (CMP) process. The planarized dielectric material is further recessed by a dry etching process, a wet etching process, and/or a combination thereof to form the isolation feature 229. As shown in FIG. 14, the stack portions of the fin-shaped structures 216 rise above the isolation feature 229 while the substrate portions of the fin-shaped structures 216 are surrounded by the isolation feature 229.

Referring to FIGS. 1, 15, 16, 17, 18, and 19, method 100 includes a block 118 where further processes are performed. Such further processes may include, for example, formation of a dummy gate stack 230 (shown in FIGS. 15 and 16), formation of at least one gate spacer layer 242 (shown in FIG. 17), formation of source/drain features 246 (shown in FIG. 17), deposition of a contact etch stop layer 248 and an interlayer dielectric (ILD) layer 250 (shown in FIG. 18), and formation of a gate structure 260 (shown in FIG. 19). It is noted that, while these further operations are illustrated in FIGS. 15-19 as being done to one or two fin-shaped structures 216, they may be performed to any fin-shaped structure 216 on the workpiece 200, including to the first segment 216-1 or the second segment 216-2 in order to meet the design needs.

Figure 15:
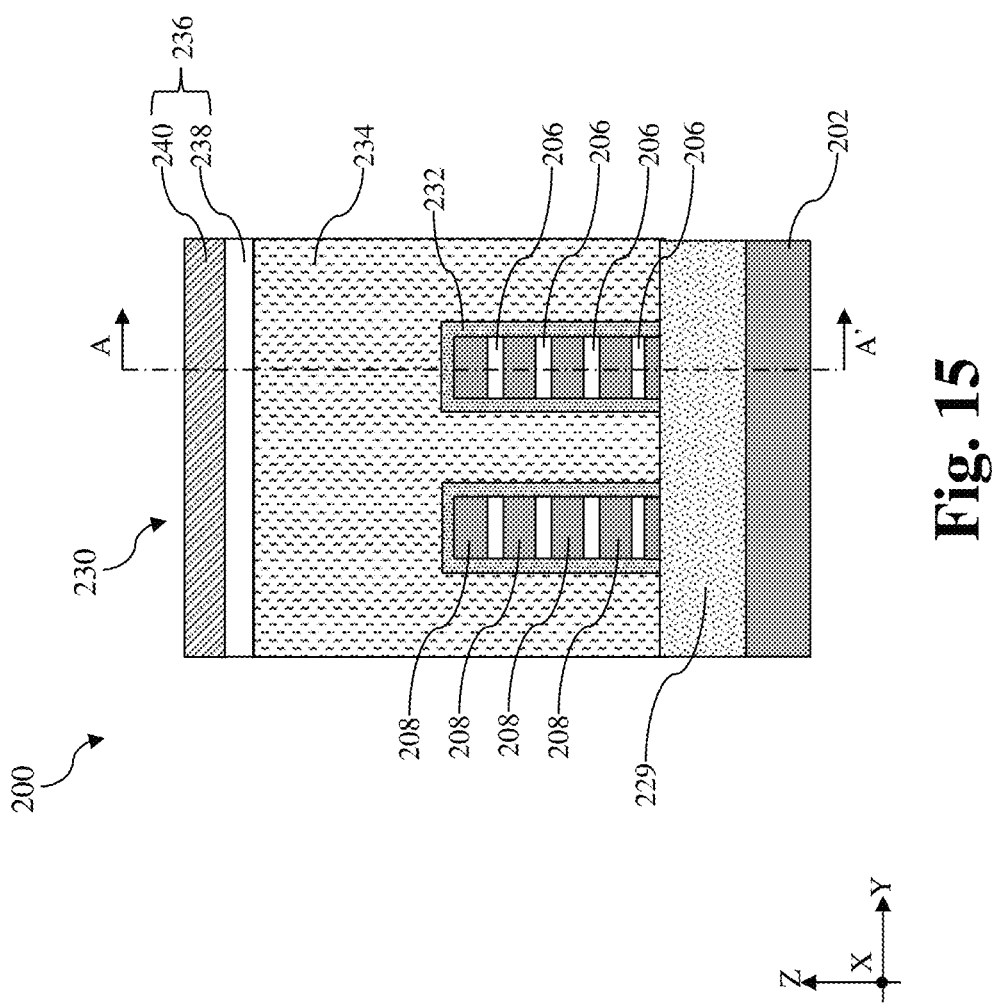
Figure 16:
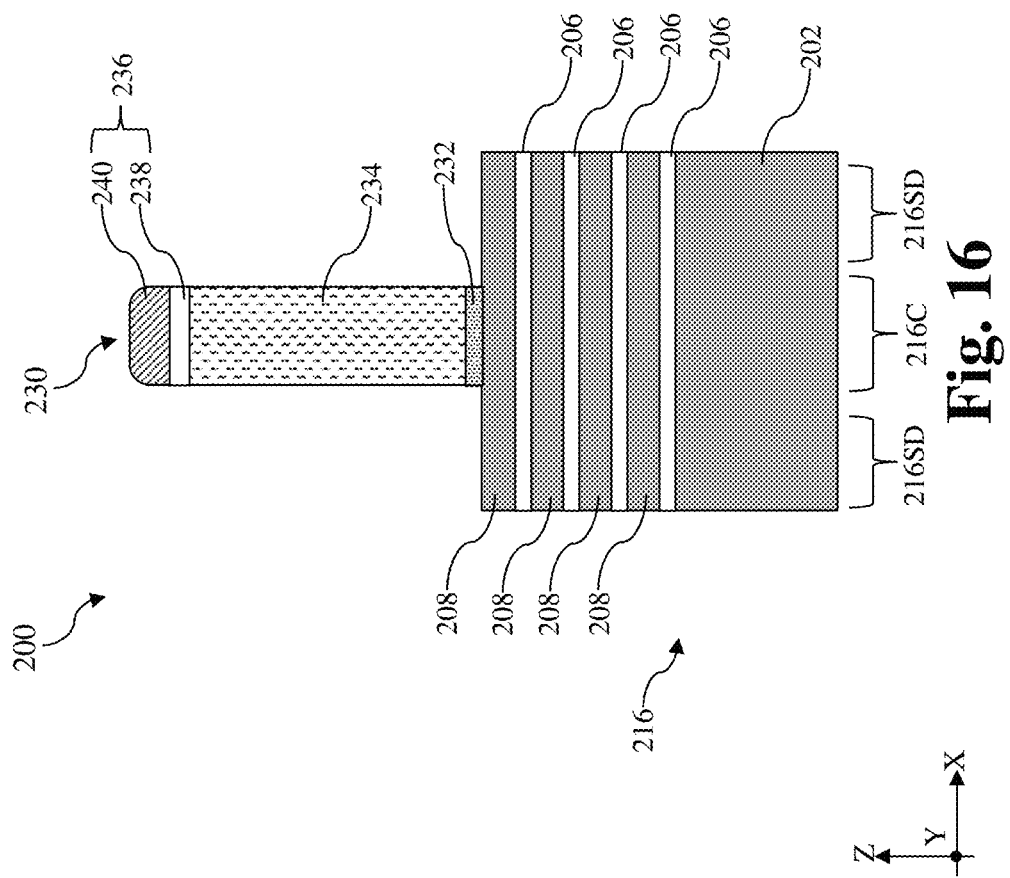
Figure 17:
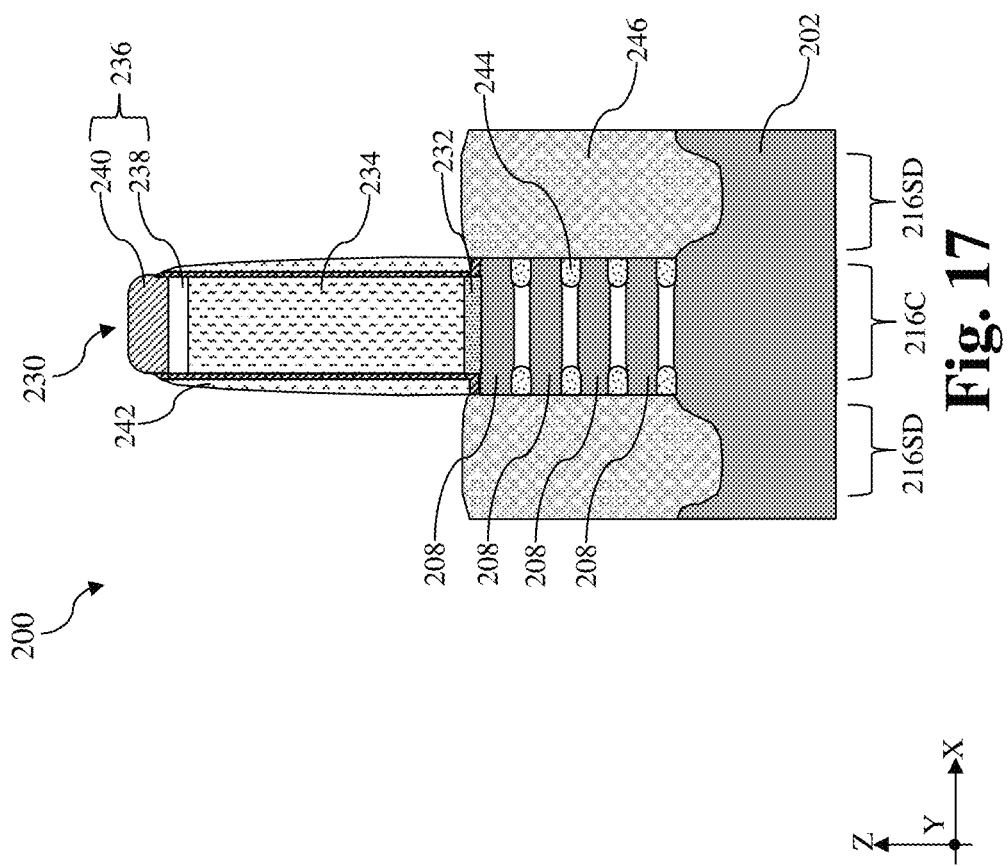
Figure 18:
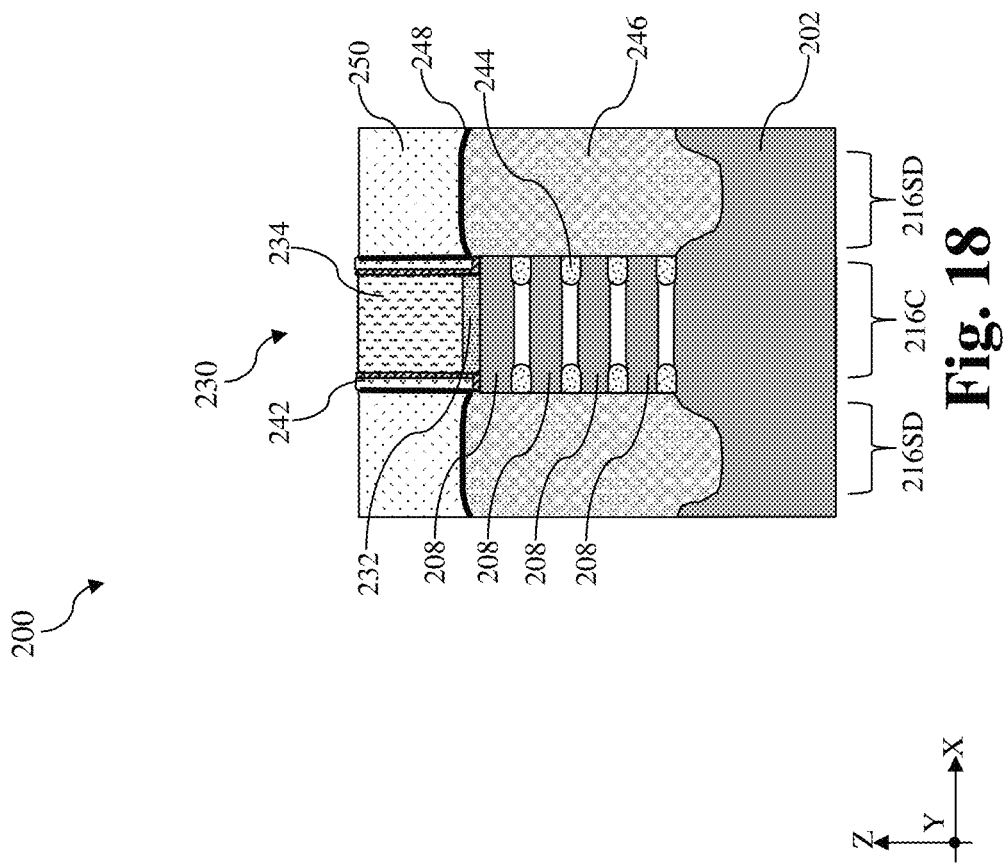
Figure 19:
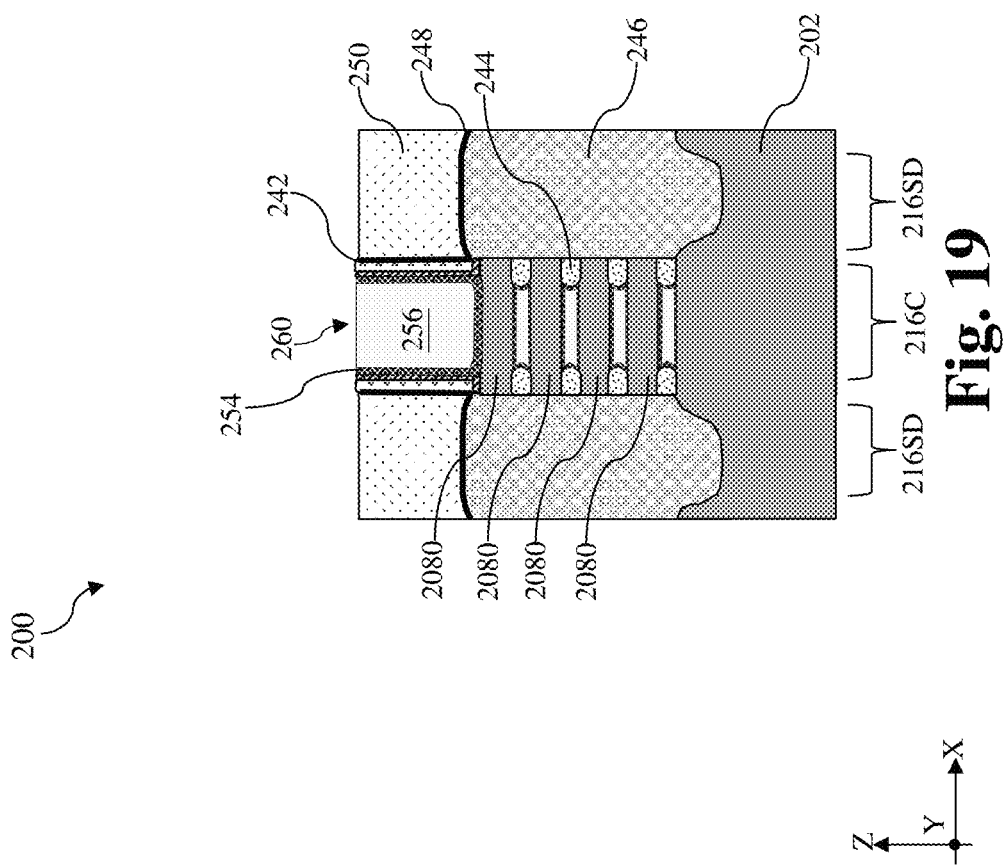

Referring to FIG. 15, the dummy gate stack 230 is formed over the fin-shaped structures 216. In some embodiments, a gate replacement process (or gate-last process) is adopted where the dummy gate stack 230 serves as placeholders for functional gate structures. Other processes and configuration are possible. As shown in FIG. 15, the dummy gate stacks 230 includes a dummy gate electrode 234 disposed over a dummy dielectric layer 232. In an example process, the dummy dielectric layer 232 is formed over the fin-shaped structures 216 by thermal oxidation or deposition. A material layer for the dummy gate electrodes 234 is then blanketly deposited over the dummy dielectric layer 232. In order to pattern the dummy gate stack 230, a gate top hard mask 236 is deposited over the material layer for the dummy gate electrode 234. The gate top hard mask 236 may be a multi-layer and include a silicon nitride mask layer 238 and a silicon oxide mask layer 240 over the silicon nitride mask layer 238. The material layer for the dummy gate electrodes 234 and the dummy dielectric layer 232 are then patterned using photolithography processes to form the dummy gate stack 230. In some embodiments, the dummy dielectric layer 232 may include silicon oxide and the dummy gate electrodes 234 may include polycrystalline silicon (polysilicon). Cross-section A-A' in FIG. 15 is illustrated in FIG. 16. As shown in FIG. 16, a region of a fin-shaped structure 216 underlying the dummy gate stacks 230 may be referred to as a channel regions 216C. The channel regions 216C of the fin-shaped structure 216 is sandwiched between two source/drain regions 216SD for source/drain formation. FIGS. 17-19 also illustrate further operations performed to the workpiece 200 along cross-section A-A' of FIG. 15.

Reference is now made to FIG. 17. At least one gate spacer layer 242 is formed along sidewalls of the dummy gate stacks 230. The at least one gate spacer layer 242 may include two or more gate spacer layers. Dielectric materials for the at least one gate spacer layer 242 may be selected to allow selective removal of the dummy gate stacks 230. Suitable dielectric materials may include silicon nitride, silicon oxycarbonitride, silicon carbonitride, silicon oxide, silicon oxycarbide, silicon carbide, silicon oxynitride, and/or combinations thereof. The at least one gate spacer layer 242 may be conformally deposited over the workpiece 200 using CVD, subatmospheric CVD (SACVD), or ALD.

Reference is still made to FIG. 17. The source/drain regions 216SD are recessed to form source/drain trenches and source/drain features 246 are epitaxially deposited in the source/drain trenches. With the dummy gate stacks 230 and the at least one gate spacers 242 serving as an etch mask, the workpiece 200 is anisotropically etched to form the source/drain trenches (shown as being filled with the source/drain features 246 in FIG. 17) over the source/drain regions 216SD. The anisotropic etch may include a dry etch process or a suitable etch process. For example, the dry etch process may implement an oxygen-containing gas, hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. Before the source/drain features 246 are formed, inner spacer features 244 are formed. In an example process to form the inner spacer features 244, the sacrificial layers 206 exposed in the source/drain trenches are first selectively and partially recessed to form inner spacer recesses (shown as being filled with the inner spacer features 244), while the exposed channel layers 208 are substantially unetched. In an embodiment where the channel layers 208 consist essentially of silicon (Si) and sacrificial layers 206 consist essentially of silicon germanium (SiGe), the selective and partial recess of the sacrificial layers 206 may include a selective wet etching process that includes a hydrogen fluoride (HF) or $NH_4OH$ etchant. An inner spacer material layer is then conformally deposited using CVD or ALD over the workpiece 200, including over and into the inner spacer recesses. The inner spacer material may include silicon nitride, silicon oxycarbonitride, silicon carbonitride, silicon oxide, silicon oxycarbide, silicon carbide, or silico oxynitride. After the deposition of the inner spacer material layer, the inner spacer material layer is etched back to form inner spacer features 244.

After the workpiece 200 undergoes a cleaning process to remove contaminants, source/drain features 246 are formed in the source/drain trenches. In some embodiments, the source/drain features 246 is first selectively and epitaxially deposited on the exposed semiconductor surfaces of the channel layers 208 and the substrate 202. The source/drain features 246 may be deposited using an epitaxial process, such as vapor-phase epitaxy (VPE), ultra-high vacuum CVD (UHV-CVD), molecular beam epitaxy (MBE), and/or other suitable processes. The source/drain features 246 may be either n-type or p-type. When the source/drain features 246 are n-type, it may include silicon (Si) and may be doped with an n-type dopant, such as phosphorus (P) or arsenic (As). When the source/drain features 246 are p-type, it may include silicon germanium (SiGe) or germanium (Ge) and may be doped with a p-type dopant, such as boron (B) or boron difluoride ($BF_2$). Doping of the source/drain feature 246 may be performed either in situ with their deposition or ex situ using an implantation process, such as a junction implant process. Although the epitaxial deposition of the source/drain feature 246 is selectively to semiconductor surfaces, overgrowth of the source/drain feature 246 may merge over the inner spacer features 244.

Reference is now made to FIG. 18. The further processes at block 118 may include deposition of a contact etch stop layer (CESL) 248 and an interlayer dielectric (ILD) layer 250. In an example process, the CESL 248 is first conformally deposited over the workpiece 200 and then the ILD layer 250 is blanketly deposited over the CESL 248. The CESL 248 may include silicon nitride, silicon oxide, silicon oxynitride, and/or other materials known in the art. The CESL 248 may be deposited using CVD, ALD, plasma-enhanced chemical vapor deposition (PECVD) process and/or other suitable deposition. In some embodiments, the ILD layer 250 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 250 may be deposited by spin-on coating, an FCVD process, or other suitable deposition technique. In some embodiments, after formation of the ILD layer 250, the workpiece 200 may be annealed to improve integrity of the ILD layer 250. To remove excess materials and to expose top surfaces of the dummy gate electrodes 234 of the dummy gate stacks 230, a planarization process (such a chemical mechanical polishing (CMP) process) may be performed to the workpiece 200 to provide a planar top surface, as illustrated in FIG. 18. Top surfaces of the dummy gate electrodes 234 are exposed on the planar top surface.

Referring to FIG. 19, the dummy gate stack 230 is removed, the sacrificial layers 206 in the channel region 216C are selectively removed to release the channel layers 208 as channel members 2080, and the gate structure 260 is formed to wrap around each of the channel members 2080 in the channel region 216C. In an example process, the dummy gate stacks 230 exposed due to the planarization process is removed using one or more etching processes that are selective to the material in the dummy gate stacks 230. For example, the removal of the dummy gate stacks 230 may be performed using as a selective wet etch, a selective dry etch, or a combination thereof. After the removal of the dummy gate stacks 230, sidewalls of channel layers 208 and sacrificial layers 206 in the channel regions 216C are exposed. The exposed sacrificial layers 206 between the channel layers 208 in the channel regions 216C may be selectively removed to release the channel layers 208 to form channel members 2080. The channel members 2080 are vertically stacked along the Z direction. The selective removal of the sacrificial layers 206 may be implemented by selective dry etch, selective wet etch, or other selective etch processes. In some embodiments, the selective wet etching includes an APM etch (e.g., ammonia hydroxide-hydrogen peroxide-water mixture).

The gate structure 260 is then deposited to wrap around each of the channel members 2080. The gate structure 260 may include a gate dielectric layer 254 and a gate electrode layer 256. Although not explicitly shown, the gate dielectric layer 254 may include an interfacial layer and a high-k dielectric layer. As used herein, a high-k dielectric material refers to a dielectric material with a dielectric constant greater than that of silicon oxide, which is about 3.9. In some embodiments, the interfacial layer includes silicon oxide and may be formed as result of a pre-clean process. An example pre-clean process may include use of RCA SC-1 (ammonia, hydrogen peroxide and water) and/or RCA SC-2 (hydrochloric acid, hydrogen peroxide and water). The pre-clean process oxidizes the exposed surfaces of the channel members 2080 and the substrate 202 to form the interfacial layer. The high-k dielectric layer is then deposited over the interfacial layer using ALD, CVD, and/or other suitable methods. The high-k dielectric layer may include hafnium oxide (HfO). Alternatively, the high-k dielectric layer may include other high-K dielectrics, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), (Ba,Sr)$TiO_3$ (BST), silicon nitride (SiN), silicon oxynitride (SiON), combinations thereof, or other suitable material.

The gate electrode layer 256 may be a multi-layer structure that includes at least one work function layer and a metal fill layer. By way of example, the at least one work function layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), or tantalum carbide (TaC). The metal fill layer may include aluminum (Al), tungsten (W), nickel (Ni), titanium (Ti), ruthenium (Ru), cobalt (Co), platinum (Pt), tantalum silicon nitride (TaSiN), copper (Cu), other refractory metals, or other suitable metal materials or a combination thereof. In various embodiments, the gate electrode layer 256 may be formed by ALD, PVD, CVD, e-beam evaporation, or other suitable process. In various embodiments, a planarization process, such as a CMP process, may be performed to remove excessive materials to provide a substantially planar top surface of the gate structures.

Embodiments of the present disclosure provide advantages. Methods of the present disclosure etch one or more hard mask layer in a trench of a patterned masking layer to prevent over-etch of the fin-shaped structures outside a window of the patterned masking layer. Methods of the present disclosure also implement a selective etch process to remove hard mask layer residues around corners of the trench. By removing the hard mask layer residues, methods of the present disclosure ensure satisfactory cut of an active region of a multi-gate device.

In one exemplary aspect, the present disclosure is directed to a method. The method includes forming a stack over a substrate, the stack including a plurality of channel layers interleaved by a plurality of sacrificial layers, depositing a first hard mask layer over the stack, depositing a second hard mask layer over the first hard mask layer, depositing a third hard mask layer over the second hard mask layer, patterning the first hard mask layer, the second hard mask layer, the third hard mask layer, the stack, and the substrate into a plurality of fin-shaped structures, forming a patterned masking layer over the plurality of fin-shaped structures, the patterned masking layer including a window to expose a portion of the plurality of fin-shaped structures, performing a first etch process to etch the third hard mask layer through the window, after the first etch process, performing a second etch process to etch the second hard mask layer through the window, after the second etch process, performing a third etch process to substantially remove the second hard mask layer exposed through the window, and after the third etch process, etching the portion of the plurality of fin-shaped structures to separate at least one of the plurality of fin-shaped structures into a first segment and a second segment. A composition of the second hard mask layer is different from a composition of the first hard mask layer or a composition of the third hard mask layer.

In some embodiments, the first hard mask layer includes silicon oxide, the second hard mask layer includes silicon nitride, and the third hard mask layer includes silicon oxide. In some implementations, after the forming of the patterned masking layer, the patterned masking layer in the window covers sidewalls of the second hard mask layer but exposes the third hard mask layer. In some instances, the patterned masking layer includes a bottom layer and a middle layer over the bottom layer. In some embodiments, the middle layer includes carbon (C), hydrogen (H), oxygen (O), and nitrogen (N). In some embodiments, the bottom layer includes carbon (C), hydrogen (H), oxygen (O), silicon (Si), nitrogen (N), or fluorine (F). In some instances, the third etch process includes use of fluoromethane ($CH_3F$), sulfur dioxide ($SO_2$), oxygen ($O_2$), argon (Ar), or helium (He). In some embodiments, the third etch process includes a pressure between about 70 mTorr and about 100 mTorr. In some instances, during the third etch process, a flow rate of fluoromethane is between about 100 standard cubic centimeter (sccm) and about 180 sccm, a flow rate of sulfur dioxide is between about 10 sccm and about 20 sccm, a flow rate of oxygen is between about 10 sccm and about 20 sccm, a flow rate of argon is between about 800 sccm and about 1000 sccm, and a flow rate of helium is between about 200 sccm and about 250 sccm. In some embodiments, the method may further include after the third etch process, forming an isolation feature around the first segment and the second segment.

In another exemplary aspect, the present disclosure is directed to a method. The method includes receiving a workpiece including a fin-shaped structure, a first hard mask layer over the fin-shaped structure and a second hard mask layer over the first hard mask layer, forming a patterned masking layer over the workpiece, the patterned masking layer including a mask portion and a window portion, wherein a thickness of the mask portion is greater than a thickness of the window portion such that the second hard mask layer is exposed through the window portion, performing a first etch process to etch the exposed second hard mask layer to expose the first hard mask layer through the window portion, after the first etch process, performing a second etch process to etch the exposed first hard mask layer, thereby leaving behind first hard mask layer residues, after the second etch process, performing a third etch process to remove the first hard mask layer residues and a portion of the patterned masking layer, and after the third etch process, etching the fin-shaped structure through the window portion to divide the fin-shaped structure into a first segment and a second segment.

In some embodiments, the first hard mask layer includes silicon nitride and the second hard mask layer includes silicon oxide. In some embodiments, after the third etch process, a top surface of the window portion is below a top surface of the fin-shaped structure. In some implementations, the patterned masking layer includes a bottom layer and a middle layer over the bottom layer, the middle layer includes between about 5% and about 20% of carbon, between about 30% and about 50% of oxygen, and between about 30% and about 50% of silicon, and the bottom layer includes between about 30% and about 80% of carbon. In some instances, the method may further include after the etching of the fin-shaped structure, forming an isolation feature around the first segment and the second segment.

In yet another exemplary aspect, the present disclosure is directed to a method. The method includes forming a fin-shaped structure, the fin-shaped structure including a plurality of semiconductor layers, a first hard mask layer over the plurality of semiconductor layers, a second hard mask layer over the first hard mask layer, a third hard mask layer over the second hard mask layer, forming a patterned masking layer having a mask portion and a window portion, wherein a thickness of the mask portion is greater than a thickness of the window portion such that the third hard mask layer is exposed through the window portion, performing a first etch process to etch the exposed third hard mask layer to expose the second hard mask layer through the window portion, after the first etch process, performing a second etch process to etch the exposed second hard mask layer, thereby leaving behind second hard mask layer residues, after the second etch process, performing a third etch process to remove the second hard mask layer residues and a portion of the patterned masking layer, after the third etch process, etching the plurality of semiconductor layers in the fin-shaped structure through the window portion to divide the fin-shaped structure into a first segment and a second segment, and after the third etch process, forming an isolation feature around the first segment and the second segment.

In some embodiments, the first hard mask layer includes silicon oxide, the second hard mask layer includes silicon nitride, and the third hard mask layer includes silicon oxide. In some instances, a thickness of the third hard mask layer is greater than a thickness of the second hard mask layer and the thickness of the second hard mask layer is greater than a thickness of the first hard mask layer. In some instances, after the third etch process, a top surface of the window portion is below a top surface of the plurality of semiconductor layers. In some embodiments, after the first etch process, a top surface of the window portion is above a top surface of the second hard mask layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a stack over a substrate, the stack comprising a plurality of channel layers interleaved by a plurality of sacrificial layers;
   depositing a first hard mask layer over the stack;
   depositing a second hard mask layer over the first hard mask layer;
   depositing a third hard mask layer over the second hard mask layer;
   patterning the first hard mask layer, the second hard mask layer, the third hard mask layer, the stack, and the substrate into a plurality of fin-shaped structures;
   forming a patterned masking layer over the plurality of fin-shaped structures, the patterned masking layer including a window to expose a portion of the plurality of fin-shaped structures;
   performing a first etch process to etch the third hard mask layer through the window;
   after the first etch process, performing a second etch process to etch the second hard mask layer through the window;
   after the second etch process, performing a third etch process to substantially remove the second hard mask layer exposed through the window; and
   after the third etch process, etching the portion of the plurality of fin-shaped structures to separate at least one of the plurality of fin-shaped structures into a first segment and a second segment,
   wherein a composition of the second hard mask layer is different from a composition of the first hard mask layer or a composition of the third hard mask layer.

2. The method of claim 1,
   wherein the first hard mask layer comprises silicon oxide,
   wherein the second hard mask layer comprises silicon nitride,
   wherein the third hard mask layer comprises silicon oxide.

3. The method of claim 1, wherein, after the forming of the patterned masking layer, the patterned masking layer in the window covers sidewalls of the second hard mask layer but exposes the third hard mask layer.

4. The method of claim 1, wherein the patterned masking layer comprises a bottom layer and a middle layer over the bottom layer.

5. The method of claim 4, wherein the middle layer comprises carbon (C), hydrogen (H), oxygen (O), and nitrogen (N).

6. The method of claim 4, wherein the bottom layer comprises carbon (C), hydrogen (H), oxygen (O), silicon (Si), nitrogen (N), or fluorine (F).

7. The method of claim 1, wherein the third etch process comprises use of fluoromethane ($CH_3F$), sulfur dioxide ($SO_2$), oxygen ($O_2$), argon (Ar), or helium (He).

8. The method of claim 7, wherein the third etch process comprises a pressure between about 70 mTorr and about 100 mTorr.

9. The method of claim 7, wherein, during the third etch process, a flow rate of fluoromethane is between about 100 standard cubic centimeter (sccm) and about 180 sccm, a flow rate of sulfur dioxide is between about 10 sccm and about 20 sccm, a flow rate of oxygen is between about 10 sccm and about 20 sccm, a flow rate of argon is between about 800 sccm and about 1000 sccm, and a flow rate of helium is between about 200 sccm and about 250 sccm.

10. The method of claim 1, further comprising:
after the third etch process, forming an isolation feature around the first segment and the second segment.

11. A method, comprising:
receiving a workpiece including a fin-shaped structure, a first hard mask layer over the fin-shaped structure and a second hard mask layer over the first hard mask layer;
forming a patterned masking layer over the workpiece, the patterned masking layer including a mask portion and a window portion, wherein a thickness of the mask portion is greater than a thickness of the window portion such that the second hard mask layer is exposed through the window portion;
performing a first etch process to etch the exposed second hard mask layer to expose the first hard mask layer through the window portion;
after the first etch process, performing a second etch process to etch the exposed first hard mask layer, thereby leaving behind first hard mask layer residues;
after the second etch process, performing a third etch process to remove the first hard mask layer residues and a portion of the patterned masking layer; and
after the third etch process, etching the fin-shaped structure through the window portion to divide the fin-shaped structure into a first segment and a second segment.

12. The method of claim 11,
wherein the first hard mask layer comprises silicon nitride,
wherein the second hard mask layer comprises silicon oxide.

13. The method of claim 11, wherein, after the third etch process, a top surface of the window portion is below a top surface of the fin-shaped structure.

14. The method of claim 11,
wherein the patterned masking layer comprises a bottom layer and a middle layer over the bottom layer,
wherein the middle layer comprises between about 5% and about 20% of carbon, between about 30% and about 50% of oxygen, and between about 30% and about 50% of silicon,
wherein the bottom layer comprises between about 30% and about 80% of carbon.

15. The method of claim 11, further comprising:
after the etching of the fin-shaped structure, forming an isolation feature around the first segment and the second segment.

16. A method, comprising:
forming a fin-shaped structure, the fin-shaped structure including a plurality of semiconductor layers, a first hard mask layer over the plurality of semiconductor layers, a second hard mask layer over the first hard mask layer, a third hard mask layer over the second hard mask layer;
forming a patterned masking layer having a mask portion and a window portion, wherein a thickness of the mask portion is greater than a thickness of the window portion such that the third hard mask layer is exposed through the window portion;
performing a first etch process to etch the exposed third hard mask layer to expose the second hard mask layer through the window portion;
after the first etch process, performing a second etch process to etch the exposed second hard mask layer, thereby leaving behind second hard mask layer residues;
after the second etch process, performing a third etch process to remove the second hard mask layer residues and a portion of the patterned masking layer;
after the third etch process, etching the plurality of semiconductor layers in the fin-shaped structure through the window portion to divide the fin-shaped structure into a first segment and a second segment; and
after the third etch process, forming an isolation feature around the first segment and the second segment.

17. The method of claim 16,
wherein the first hard mask layer comprises silicon oxide,
wherein the second hard mask layer comprises silicon nitride,
wherein the third hard mask layer comprises silicon oxide.

18. The method of claim 16,
wherein a thickness of the third hard mask layer is greater than a thickness of the second hard mask layer,
wherein the thickness of the second hard mask layer is greater than a thickness of the first hard mask layer.

19. The method of claim 16, wherein, after the third etch process, a top surface of the window portion is below a top surface of the plurality of semiconductor layers.

20. The method of claim 16, wherein, after the first etch process, a top surface of the window portion is above a top surface of the second hard mask layer.

* * * * *